United States Patent
Lin et al.

(10) Patent No.: US 8,735,988 B2
(45) Date of Patent: May 27, 2014

(54) SEMICONDUCTOR DEVICE HAVING A FIRST SPACER ELEMENT AND AN ADJACENT SECOND SPACER ELEMENT

(71) Applicant: Taiwan Semiconductor Manufacturing Company, Ltd., Hsin-Chu (TW)

(72) Inventors: Yun Jing Lin, Hsinchu (TW); Wei-Han Fan, Hsinchu (TW); Yu-Hsien Lin, Hsinchu (TW); Yimin Huang, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/871,230

(22) Filed: Apr. 26, 2013

(65) Prior Publication Data

US 2013/0234255 A1    Sep. 12, 2013

Related U.S. Application Data

(62) Division of application No. 12/951,676, filed on Nov. 22, 2010, now Pat. No. 8,455,952.

(51) Int. Cl.
| | |
|---|---|
| *H01L 29/76* | (2006.01) |
| *H01L 29/94* | (2006.01) |
| *H01L 31/062* | (2012.01) |
| *H01L 31/113* | (2006.01) |
| *H01L 31/119* | (2006.01) |

(52) U.S. Cl.
USPC ............................ 257/369; 257/288; 438/300

(58) Field of Classification Search
USPC .................. 257/288, 309, E29.242; 438/300
See application file for complete search history.

(56) References Cited

U.S. PATENT DOCUMENTS

| | | | | |
|---|---|---|---|---|
| 6,630,716 | B1* | 10/2003 | Juengling | 257/369 |
| 8,202,767 | B2 | 6/2012 | Cheng et al. | |
| 8,253,204 | B2* | 8/2012 | Lee et al. | 257/368 |
| 2009/0246922 | A1* | 10/2009 | Wu et al. | 438/231 |
| 2010/0078728 | A1* | 4/2010 | Li et al. | 257/369 |
| 2011/0212584 | A9* | 9/2011 | Chakravarthi et al. | 438/197 |
| 2011/0256682 | A1 | 10/2011 | Yu | |

* cited by examiner

*Primary Examiner* — Phuc Dang
(74) *Attorney, Agent, or Firm* — Haynes and Boone, LLP

(57) ABSTRACT

The present disclosure describes a semiconductor device including a semiconductor substrate and a gate stack disposed on the semiconductor substrate. A first spacer element is disposed on the substrate abutting the first gate stack. In an embodiment, the first spacer element includes silicon nitride. A second spacer element is adjacent the first spacer element. In an embodiment, the second spacer element includes silicon oxide. A raised source and a first raised drain is provided laterally contacting sidewalls of the second spacer element. In an embodiment, a contact directly interfaces with the second spacer element.

19 Claims, 6 Drawing Sheets

SEMICONDUCTOR DEVICE HAVING A FIRST SPACER ELEMENT AND AN ADJACENT SECOND SPACER ELEMENT

PRIORITY DATA

This patent is a divisional of U.S. Ser. No. 12/951,676 filed Nov. 22, 2010, U.S. Pat. No. 8,455,952, the entire disclosure of which is hereby incorporated by reference.

BACKGROUND

As technology nodes shrink, semiconductor devices such as a metal-oxide-semiconductor field-effect transistors (MOSFETs) are scaled down and the number of devices of an integrated circuit (IC) increase. Thus, the spacing between gates structures of the ICs decrease (e.g., the pitch in an array of gates becomes tighter). In a method to form such an IC, a dielectric layer such as an inter-level dielectric (ILD) is formed on the substrate and fills in the regions between adjacent gates. However, when an arrangement of gates becomes denser and has a smaller spacing, the ILD layer often cannot effectively fill in the regions between the adjacent gate structures. For example, voids may be formed in the ILD layer. Furthermore, alignment of contacts to the gate structure and/or other transistor features such as a source/drain region may become more difficult as the devices are scaled down. A via used to form a contact may be offset such that an etching process etches through a source/drain region (e.g., low-dose drain) region. This can induce junction leakage.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
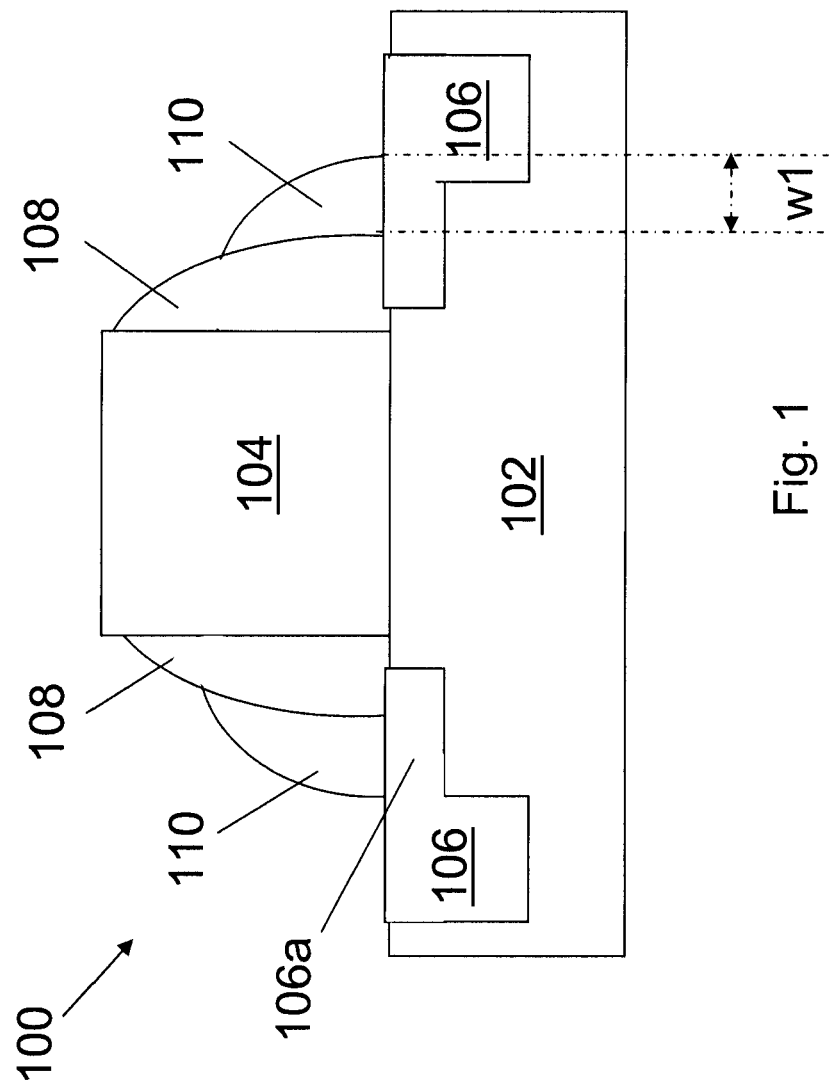
FIG. 1 is a sectional view of a semiconductor device according to aspects of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

FIG. 1 is a sectional view of a semiconductor device 100 constructed according to aspects of the present disclosure. The semiconductor device 100 includes a semiconductor substrate 102 and a gate stack 104 formed thereon. In an embodiment, the substrate 102 is a silicon substrate (e.g., wafer) in crystalline structure. The substrate 102 may include various doping configurations depending on design requirements (e.g., p-type substrate or n-type substrate). Other examples of the substrate 102 include other elementary semiconductors such as germanium and diamond; a compound semiconductor such as, silicon carbide, gallium arsenide, indium arsenide, or indium phosphide; and/or other possible compositions. The substrate 102 may optionally include an epitaxial layer (epi layer), may be strained for performance enhancement, and/or may include a silicon-on-insulator (SOI) structure. The gate stack 104 includes a gate dielectric layer and a gate electrode. One or more additional layers, for example, interface layers, capping layers, and the like may also be provided in the gate stack 104. In an embodiment, the gate stack 104 includes a high k dielectric material layer and a conductive layer formed on the high k dielectric layer (e.g., a gate electrode). The conductive layer may include polysilicon, Ti, TiN, TaN, Ta, TaC, TaSiN, W, WN, MoN, MoON, $RuO_2$, and/or other suitable materials. One or more layers formed by physical vapor deposition (PVD), chemical vapor deposition (CVD), atomic layer deposition (ALD), plating, and/or other suitable processes. In an embodiment, the gate stack 104 is has one or more layers that are sacrificial (e.g., is a dummy gate). The gate stack 104 may include a gate dielectric such as, silicon oxide, silicon nitride, silicon oxynitride, and/or other suitable materials. In an embodiment, the gate stack 104 includes a high-k gate dielectric such as metal oxides, metal nitrides, metal silicates, transition metal-oxides, transition metal-nitrides, transition metal-silicates, oxynitrides of metals, metal aluminates, zirconium silicate, zirconium aluminate, combinations thereof, or other suitable compositions. Example high-k dielectrics include hafnium oxide ($HfO_2$), hafnium silicon oxide (HfSiO), hafnium silicon oxynitride (HfSiON), hafnium tantalum oxide (HfTaO), hafnium titanium oxide (HfSiO), hafnium zirconium oxide (HfZrO), combinations thereof, and/or other suitable materials. Alternatively, the high-k dielectric layer may include other high-k dielectrics such as LaO, AlO, ZrO, TiO, $Ta_2O_5$, $Y_2O_3$, $SrTiO_3$ (STO), $BaTiO_3$ (BTO), BaZrO, HfLaO, HfSiO, LaSiO, AlSiO, $(Ba,Sr)TiO_3$ (BST), $Al_2O_3$, $Si_3N_4$, and/or other suitable materials.

The semiconductor device 102 also includes a source and a drain 106 formed in the substrate and disposed on two sides of the gate stack 104. The source and drain region 106 include a low-doped region 106a. The source and drain region 106 may be formed using ion implantation, diffusion, and/or other suitable processes. In an embodiment, the source and drain region 106 includes a SiGe region grown using suitable processes. The source/drain regions described are exemplary only and in alternative embodiments may include any lightly doped source/drain regions and/or heavily doped source/drain regions formed by suitable methods, selected for the desired transistor configuration. The semiconductor device 100 further includes a first gate spacer 108 disposed on the sidewalls of the gate stack 104. The first gate spacer 108 may be used to define a portion of the source/drain region 106. In particular, in an embodiment, the first gate spacer 108 defines the low-dose implant region 106a (e.g., low dose drain, ldd). After defining the source/drain region, the first gate spacer 108 may be etched back. In an embodiment, the first gate spacers 108 are silicon nitride. Other example compositions include silicon oxide, silicon carbide, silicon oxynitride, combinations thereof, or other suitable materials. Typical formation methods for the first gate spacers 108 include depositing a dielectric material and then anisotropically etching back the material. The first gate spacers 108 may have a multi-layer structure. In an embodiment, the first gate spacers 108 include different layers such that different layers/portions provide a different functionality, for example: a wall for a gate element used in a replacement gate process, definition of a low-dose source/drain region, and/or the formation of the raised source/drain region (e.g., alignment). In one or more of these embodiments, a portion of the first gate spacer 108 may be subsequently removed prior to the formation of a second spacer element 110, discussed below.

The semiconductor device 100 also includes a second spacer element 110. As illustrated in FIG. 1, the second spacer element 110 abuts the first gate spacer 108 and extends a portion of the height of the gate stack 104. In other words, the height of the second spacer element 110 is less than that of the first gate spacer 108. The second spacer element 110 abuts a sidewall of the first gate spacer 108 (e.g., "D-shaped" sidewall). In an embodiment, the second spacer element 110 is silicon oxide. In an embodiment, the second spacer element 110 has a width w1 that is between approximately 7 and approximately 10 nanometers. In an embodiment, the first gate spacer 108 has a width of approximately 14 nanometers (after etching back the formation of a source/drain region (e.g., low dose region and/or raised source/drain region)). The second spacer element 110 may be formed by depositing a dielectric material (e.g., silicon dioxide) and anisotropically etching back the material to form a spacer shape.

Figure 2:
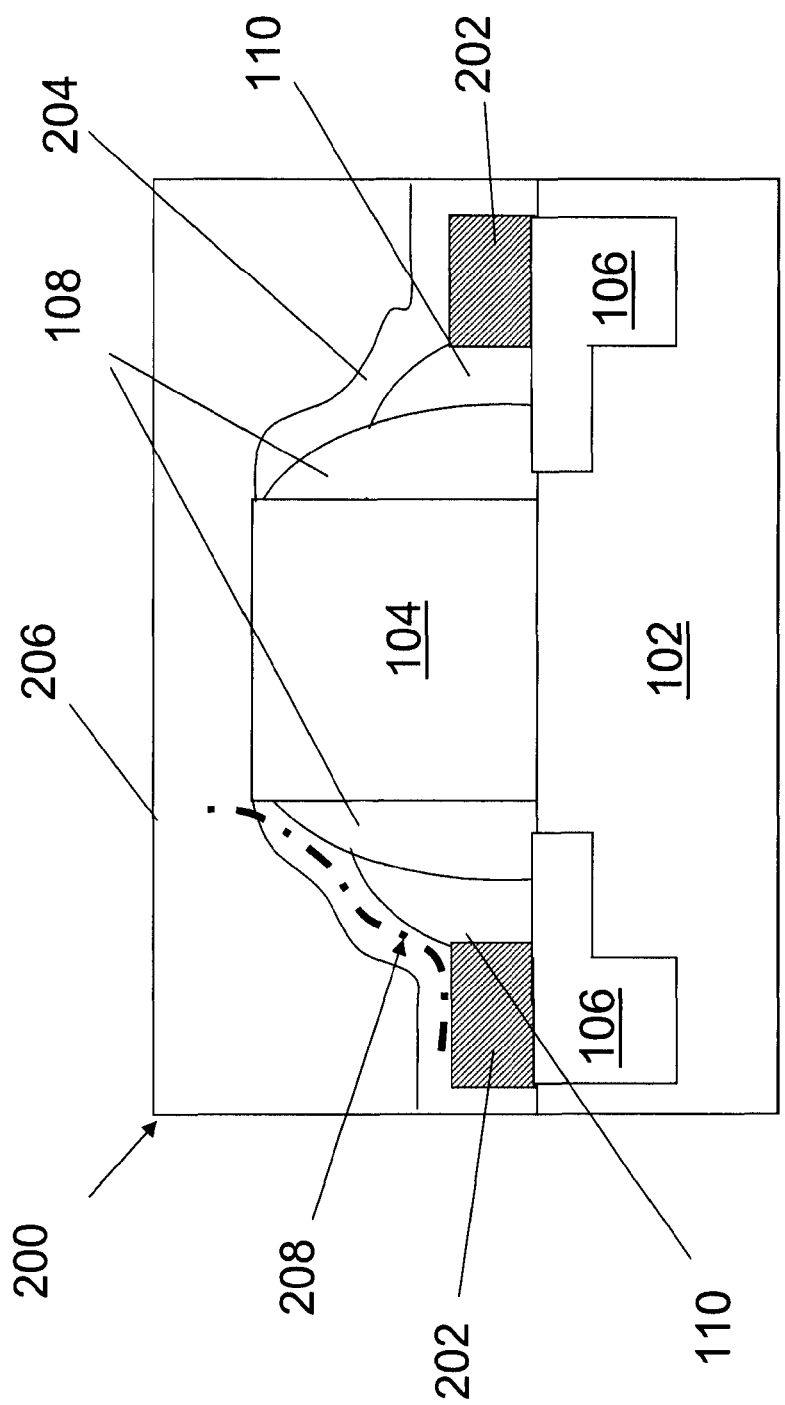
FIG. 2 is a sectional view of an embodiment of a semiconductor device according to aspects of the present disclosure at a subsequent phase of manufacturing.

Referring now to FIG. 2, illustrated is a semiconductor device 200. The device 200 includes a semiconductor substrate 102, source/drain regions 106, a gate stack 104, and first gate spacer 108, as described above with reference to FIG. 1. The device 200 further includes the second spacer element 110. As illustrated by FIG. 2, the second spacer element 110 interposes the first gate spacer 108 and a feature 202. In an embodiment, the feature 202 is a raised source/drain region. The feature 202 may be an epitaxial layer overlying the substrate 102 (e.g., wherein the source/drain is formed). In an embodiment, the feature 202 overlies a silicon and/or silicon germanium source/drain region. In an embodiment, the feature 202 includes a contact region. For example, in an embodiment, feature 202 includes a silicide layer. The silicide layer may include a silicide, such as nickel silicide, cobalt silicide, tungsten silicide, tantalum silicide, titanium silicide, platinum silicide, erbium silicide, palladium silicide, and/or combinations thereof. A silicide layer may be formed on the source drain features (including raised features) to reduce contact resistance. The silicide can be formed by a process including depositing a metal layer, annealing the metal layer such that the metal layer is able to react with silicon to form the silicide, and then removing the non-reacted metal layer.

An etch stop layer (ESL) 204 is additionally formed on top of the gate stack 104 and sidewalls of the spacers 108 and 110. In an embodiment, the ESL 204 is a contact etch stop layer (CESL). Examples of materials that may be used to form ESL 204 include silicon nitride, silicon oxide, silicon oxynitride, and/or other suitable materials. The ESL 204 may be formed by plasma-enhanced chemical vapor deposition (PECVD) process and/or other deposition or oxidation processes known in the art. The ESL 204 has a direct interface (e.g., touches) to both the first gate spacer 108 and the second spacer element 110.

An inter-level dielectric (ILD or specifically referred to as ILD0) layer 206 is formed on the top of the gate stack 104 overlying the ESL (e.g., CESL) 204. The ILD layer 206 may be formed by chemical vapor deposition (CVD), high density plasma CVD, spin-on methods, sputtering, and/or other suitable methods. Example compositions of the ILD layer 206 include silicon oxide, silicon oxynitride, a low k material, tetraethylorthosilicate (TEOS) oxide, un-doped silicon glass, or doped silicon oxide such as borophosphosilicate glass (BPSG), fused silica glass (FSG), phosphosilicate glass (PSG), boron doped silicon glass (BSG), and/or other suitable materials. In an embodiment, the ILD layer 206 is a high density plasma (HDP) dielectric.

In an embodiment, features 202 are source and raised drain features formed on the semiconductor substrate 102, and laterally contact the sidewalls of the second spacer element 110. The raised source and drain features 202 are formed by an epitaxy process after the formation of the gate spacer 108 and/or spacer elements 110. In one embodiment, the raised source and drain features are silicon and are formed by a silicon epitaxy process such that silicon is formed in crystalline form on the source and drain 106. In one example, the raised source and drain has a thickness ranging between about 50 angstroms and about 100 angstroms.

As illustrated by FIG. 2, the combination of the feature 202, the second spacer element 110, and the first gate spacer 108 provide for a profile 208. The profile 208 defines a profile of the gate stack 104 which is covered by the ILD layer 206. The profile 208 provides an improved profile by which the ILD layer 206 can be deposited on the substrate 102. In contrast, without the second spacer element 110, the resulting profile would be sharp and steep, creating a corner region having a high aspect ratio that may be difficult to fill with material. For example, typically the device 200 includes a plurality of gate stacks such as gate stack 104, some of which in close proximity. The profile 208 allows the ILD layer 206 to fill between gate stacks without voiding, which may be caused by processing difficulties in filling high aspect ratio features. An example of this is illustrated in greater detail with reference to FIG. 3.

The device 200, like the device 100, may be an intermediate device fabricated during processing of an integrated circuit, or portion thereof, that may comprise memory cells and/or other logic circuits, passive components such as resistors, capacitors, and inductors, and active components such as P-channel field effect transistors (PFET), N-channel FET (NFET), metal-oxide semiconductor field effect transistors (MOSFET), complementary metal-oxide semiconductor (CMOS) transistors, bipolar transistors, high voltage transistors, high frequency transistors, other memory cells, and combinations thereof.

Figure 3:
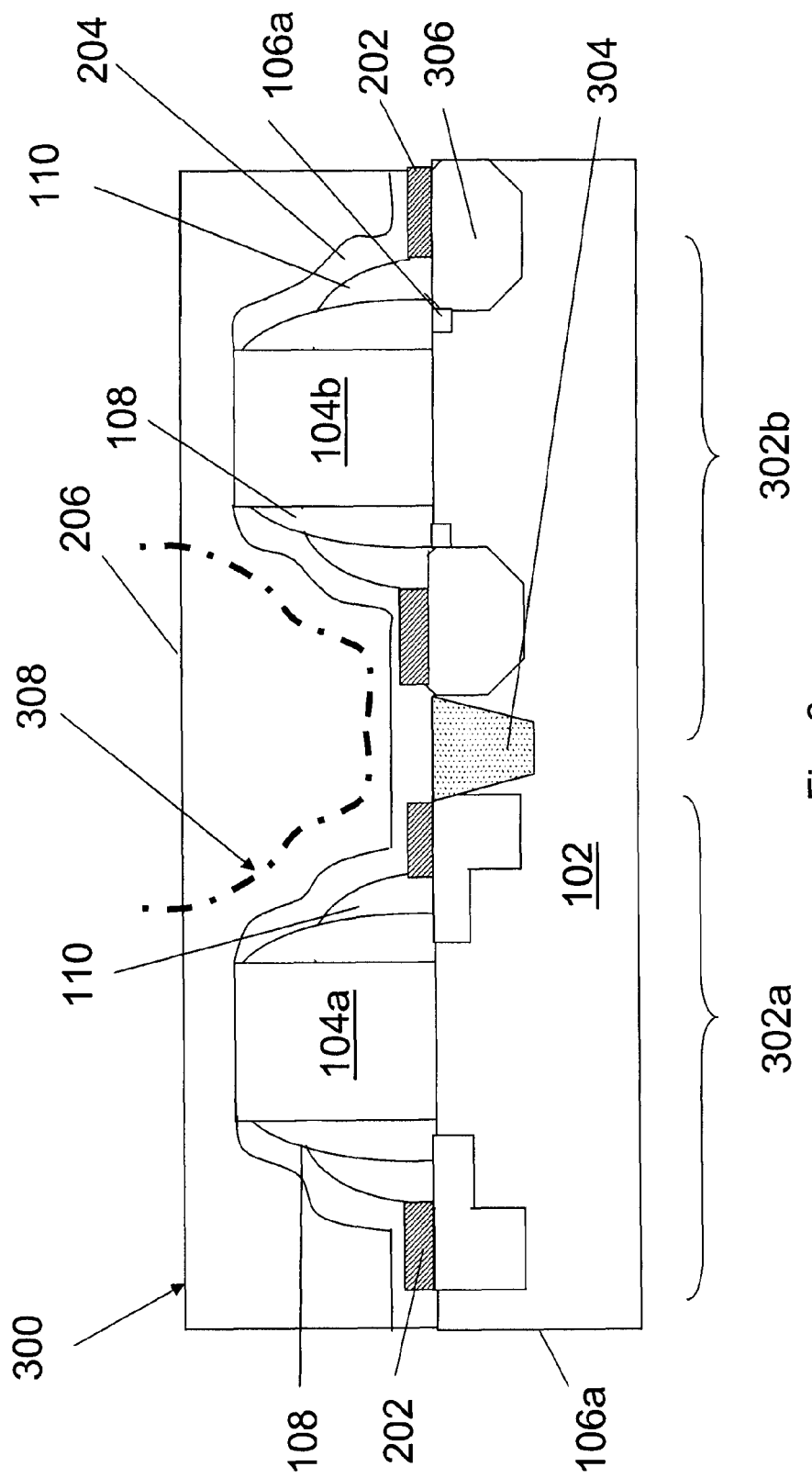
FIG. 3 is a sectional view of an embodiment of a semiconductor device according to aspects of the present disclosure including a plurality of gate stacks.

Referring now to FIG. 3, illustrated is a device 300 which includes an NMOS transistor region 302a and a PMOS transistor region 302b. An NMOS gate stack 104a and a PMOS gate stack 104b are formed on the semiconductor substrate 102 within the NMOS transistor region 302a and PMOS transistor region 302b respectively. In an embodiment, the NMOS transistor region 302a includes a p-well formed in the substrate 102 and the PMOS transistor region 302b includes an n-well formed in the substrate 102. An isolation feature 304 interposes the regions. The isolation feature 304 may be a shallow trench isolation (STI) feature and/or other suitable isolation feature. The NMOS gate stack 104a and the PMOS gate stack 104b may be substantially similar to the gate stack 104, described above with reference to FIG. 1.

The semiconductor device 300 further includes LDD regions 106a formed on the substrate 102 by one or more ion implantation processes and aligned with the associated gate stack, separately for the NMOS transistor and PMOS transistor.

Additionally, silicon germanium (SiGe) features 306 are formed on the PMOS transistor region of the substrate by an epitaxy process such that a SiGe features can be formed in crystalline state on the silicon substrate. Thereby, the strained channel can be achieved in the PMOS transistor to increase the carrier mobility and enhance the device performance. (The NMOS transistor region 302a may be protected by a patterned mask layer while forming the SiGe features.) In an embodiment, the source and drain regions 106 in the PMOS transistor region 302b are recessed by an etching process and then a SiGe epitaxy process is applied to the recessed source and drain region. In this case, the source and drain 106 include SiGe region 306.

As described above with reference to FIG. 2, raised features 202 are disposed on the substrate 102. The features 202 may provide raised source and raised drain features. In an embodiment, the raised source and drain are formed by an epitaxy process. In one embodiment, the raised source and drain have silicon and formed by a silicon epitaxy process such that silicon is formed in crystalline form on the first source and first drain. In an embodiment, the feature 202 includes a silicide layer. In an embodiment, the feature 202 of the PMOS transistor region is a silicide region overlying the source and drain region 106, which includes SiGe features.

The semiconductor device 300 further includes first gate spacers 108 disposed on sidewalls of each gate stack 104. In an embodiment, the first gate spacers 108 are formed on sidewalls of the gate stacks 104, then heavily doped source and drain 106 are formed in the substrate by one or more ion implantation processes and aligned with the first gate spacers 108, for the NNMOS transistor and PMOS transistor separately. In an embodiment, the first gate spacers 108 are formed on sidewalls of the gate stacks 104, then features 202 are formed (raised source drain regions) and aligned with the first gate spacers 108; this may be done for the NMOS transistor and PMOS transistor separately. After one or more of these processes, the first gate spacer 108 may be etched back such that a space is provided between the first gate spacer 108 and the feature 202 and/or the heavily doped source and drain 106. The spacer elements 110 may be formed in this space.

The device 300 further includes the ESL 204 and ILD layer 206. The ESL 204 and ILD layer 206 of the device 300 may be substantially similar to as discussed above with reference to FIG. 2.

The spacer elements 110 of the device 300 may be substantially similar to as described above with reference to FIGS. 1 and 2. The spacer elements 110 provide for a modified profile 308. The modified profile 308 allows for the ILD layer 206 to more easily fill between the gate stacks 204. It is noted that although depicted as an NMOS and PMOS transistor, similar benefits may be provided for adjacent NMOS transistors, adjacent PMOS transistors, and the like. The modified profile 308 is provided from the presence of the spacer elements 110.

The modified profile 308 may provide a reduced aspect ratio for the ESL 204 and/or ILD layer 206.

Various subsequent processing steps may follow the formation of the device 300. For example, chemical mechanical polishing (CMP) the ILD layer 206 may be performed such that a portion of the gate stacks 104 are exposed; one or more dummy layers in the gate stacks 104 may be replaced with metal gates. As a further example, a multilayer interconnection (MLI) structure may be formed which may include formation of contact holes and plugs as described below with reference to FIGS. 4 and 5.

Figure 4:
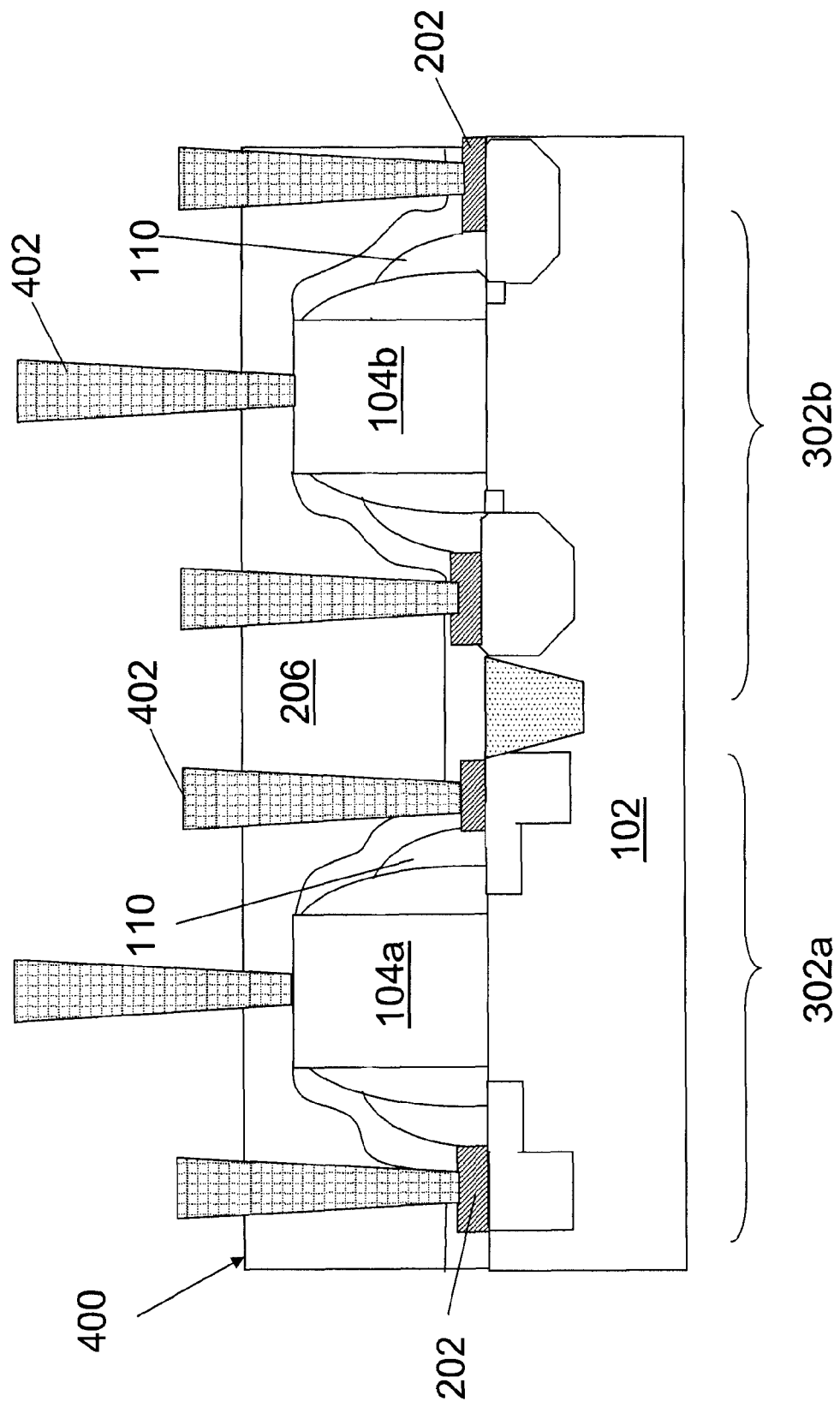
FIG. 4 is a sectional view of an embodiment of a semiconductor device according to aspects of the present disclosure including a plurality of gate stacks at a subsequent phase of manufacturing.

Referring now to FIG. 4, illustrated is the semiconductor device 300 at a subsequent processing stage, now illustrated as device 400, such that contacts 402 are formed on the substrate 102. The contacts 402 provide interconnection to the source/drain regions 106 and the gate structures 104. In an embodiment, the contacts 402 provide interconnection to a raised source and drain region of feature 202. The contacts 402 are a portion of a multilayer interconnection (MLI) structure of device 300. The multilayer interconnection includes vertical interconnects, such as conventional vias or contacts including contacts 402, and horizontal interconnects, such as metal lines. The various interconnection features may implement various conductive materials including copper, tungsten and silicide. In one example, a damascene process is used to form a multilayer interconnection structure. In an embodiment, the contacts 402 are formed by etching contact holes in the ILD layer 206 using the etch stop layer 204. The contact holes are then filled with conductive material such as tungsten, to form a contact plug.

Figure 5:
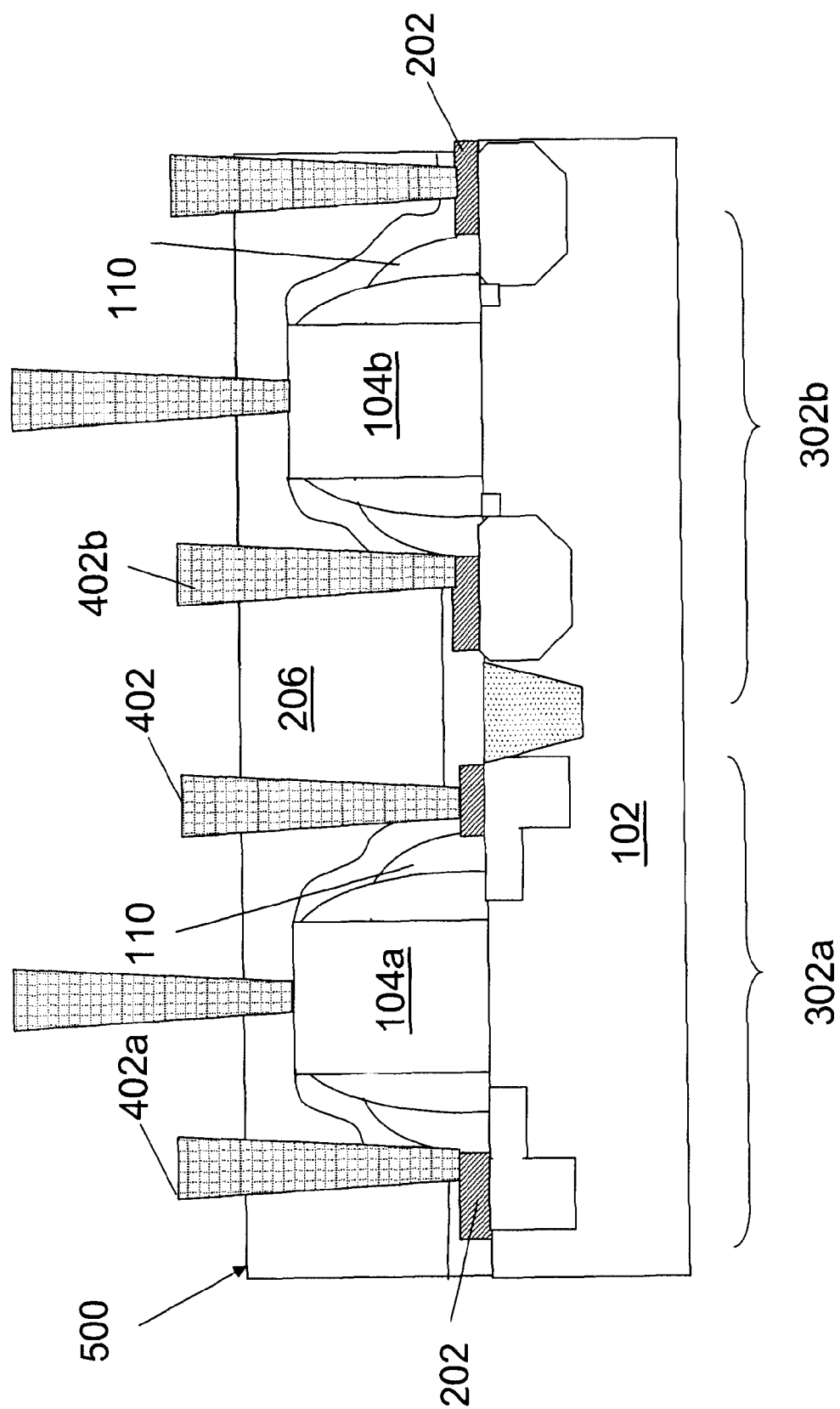
FIG. 5 is a sectional view of an alternative embodiment of a semiconductor device according to aspects of the present disclosure including a plurality of gate stacks at a subsequent phase of manufacturing.

Referring now to FIG. 5, illustrated is a device 500 which is substantially similar to the device 400 except that one or more of the contacts 402 are offset. The offset may occur as a result of normal and/or abnormal processing conditions and/or process control tolerances. The offset may become more likely and/or difficult to control as the pitch of features such as the gate stacks 104 decreases. Specifically, contacts 402a and 402b illustrate an offset of the contact such that the contact interfaces with the feature 202 in an off-centered manner, e.g., towards the gate stack 104. The contacts 402a and 402b interface with (are in direct contact with) the spacer elements 110. As described above, the spacer element 110 fills a void between the first gate spacer 108 and the feature 202 (e.g., epitaxial region). Thus, the spacer element 110 provides an etch stop for the formation of the contacts 402a and 402b. Thus, the contacts 402a and 402b are self-aligned.

Figure 6:
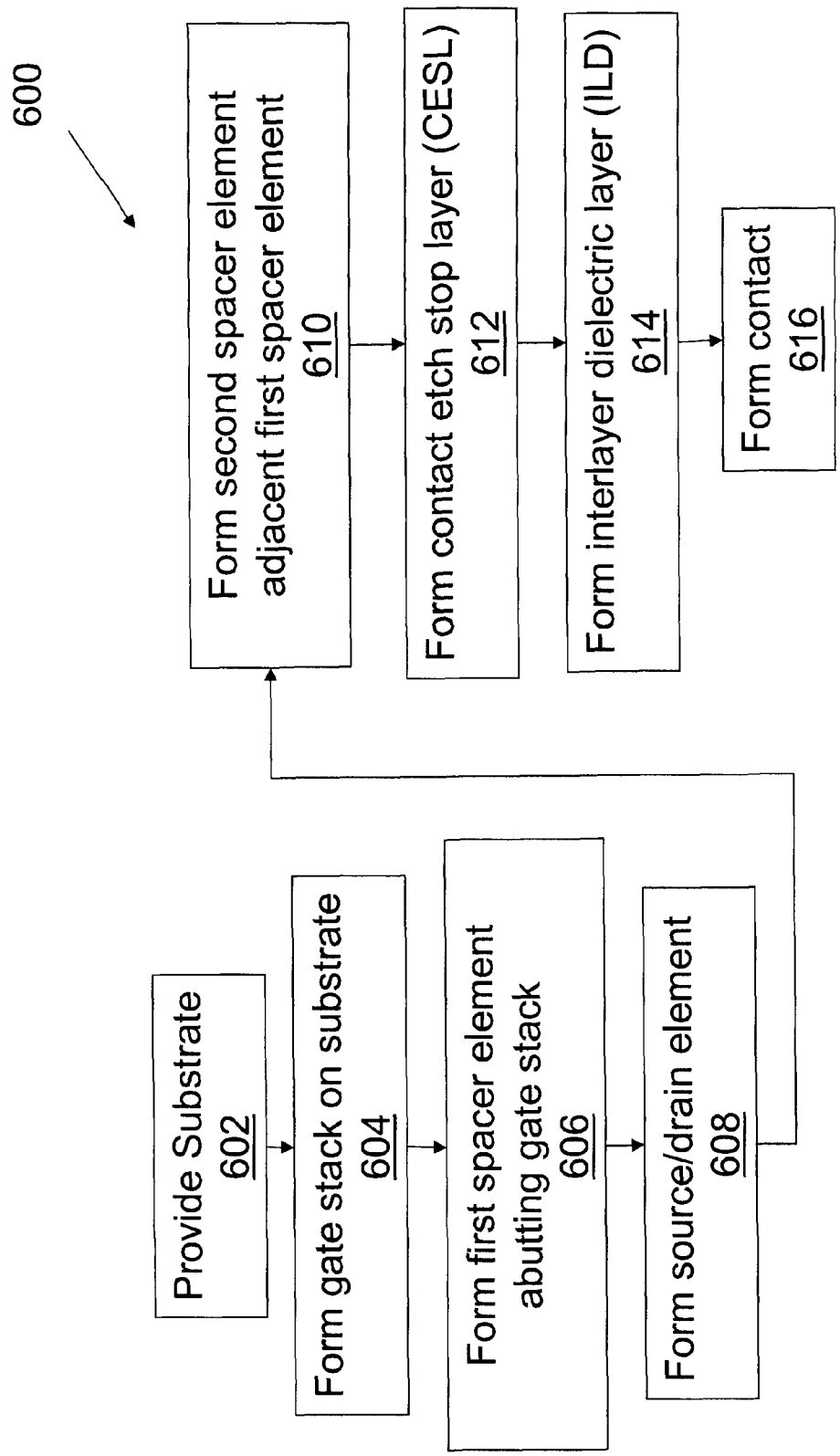
FIG. 6 is a flow chart illustrating an embodiment of a method of forming a semiconductor device according to the present disclosure.

Referring now to FIG. 6, illustrated is a method 600 of forming a semiconductor device. The method 600 may be used to form the semiconductor device 100, 200, 300, 400 and/or 500, described above with reference to FIGS. 1, 2, 3, 4, and/or 5 respectively. The method 600 begins at step 602 where a substrate is provided. The substrate may be substantially similar to the semiconductor substrate 102 described above. The method 600 then proceeds to step 604 where a gate stack is formed on the substrate. The gate stack may be substantially similar to the gate stack 104, described above. The gate stack may be associated with a PMOS or NMOS transistor. In an embodiment, the gate stack is a dummy gate.

The method 600 then proceeds to step 606 where a first spacer element is formed on the substrate abutting the gate stack. In an embodiment, the first spacer element is substantially similar to the first gate spacer 108 described above. The first spacer element may provide a "wall" that is used in the formation of a "gate last" process where a dummy gate feature (e.g., electrode) is removed from the gate stack and a metal gate electrode is formed. In an embodiment, the first spacer element defines a region on the substrate for the source/drain extension region (e.g., LDD), which may be referred to herein as off-set spacers. In an embodiment, the first spacer element is used to align an epitaxial region used for a raised source/drain region. The first spacer element may include a plurality of layers and/or materials to provide one or more of these functionalities. The first spacer element includes an off-set spacer comprising SiCN. The first spacer element (e.g., off-set spacer) may be formed by depositing material (e.g., 90A) and etching back the material to form an element of approximately 6.5 nm.

The method 600 then proceeds to step 608 where a source/drain region is formed on the substrate. The source/drain region may include a doped region formed in the substrate, a raised source/drain region (e.g., feature 202, as described above with reference to FIGS. 2, 3, and 4), a strained region such as, a SiGe region (e.g., region 306, as described above with reference to FIG. 3), and/or other regions formed by suitable processes. As indicated above, a source/drain extension region (e.g., 306a, also described above with reference to FIG. 3) may be formed prior to step 606.

The method 600 then proceeds to step 610 where a second spacer element is formed. The second spacer element may abut the first spacer element. In an embodiment, the second spacer element 610 fills in a void between the first spacer element and a feature formed on the substrate, for example, a raised source/drain epitaxial region. The second spacer element may be substantially similar to the second spacer element 110, described above. In an embodiment, the second spacer element is silicon oxide. The spacer element may be formed by depositing silicon oxide on the substrate and anisotropically etching the material back to form a spacer.

In an embodiment, prior to the formation of the second spacer element, the first spacer element, described above in step 606, is etched back. The second spacer element may be formed in the space created by the etching back of the first spacer element. For example, in an embodiment, a nitride spacer (e.g., first spacer) may be etched back and a second spacer element including silicon oxide formed in the space created by the etching back. In an embodiment, the first spacer element may be etched back and another spacer element, or portion thereof, formed in its place prior to the formation of the second spacer element.

The method 600 then proceeds to step 612 where a contact etch stop layer (CESL) is formed on the substrate. The contact etch stop layer may be substantially similar to the etch stop layer 204, described above with reference to FIG. 2. The CESL may be formed by plasma-enhanced chemical vapor deposition (PECVD) process and/or other deposition or oxidation processes known in the art.

The method 600 then proceeds to step 614 where an interlayer dielectric layer (ILD) is formed on the substrate. The ILD layer may be substantially similar to the ILD layer 206, described above with reference to FIG. 2. The ILD layer may be the first ILD layer of a plurality of ILD layers included in a multiple layer interconnect structure. The ILD layer may be formed by chemical vapor deposition (CVD), high density plasma CVD, spin-on methods, sputtering, and/or other suitable methods. The ILD layer typically fills a region between and overlying a plurality of gate stacks. The region may have a modified profile as described above with reference to FIGS. 2 and 3.

The method 600 then proceeds to step 616 where a plurality of contacts are formed on the substrate. The contacts may be formed by etching contact holes in the ILD layer that such that a portion of the source/drain region (e.g., a silicide layer overlying the source/drain region) is exposed. The etching of the contact holes may use the second spacer as an etch stop layer. Thus, the contact holes may be self-aligned such that they contact the appropriate source/drain region. Conductive material is then used to fill the contact holes and provide interconnection to one or more lines of a MLI structure formed on the substrate.

Although embodiments of the present disclosure have been described in detail, those skilled in the art should understand that they may make various changes, substitutions and alterations herein without departing from the spirit and scope of the present disclosure.

Embodiments of the disclosed methods and/or device structures can eliminate or reduce gap-filling (e.g., ILD filling) issues between features (e.g., gates) disposed at a small pitch. In other embodiments, the methods and/or device structures disclosed herein can provide for an etch stop layer to improve the formation of a contact feature.

Thus, the present disclosure provides a semiconductor device. The semiconductor device includes a semiconductor substrate and a first gate stack disposed on the semiconductor substrate. A first spacer element is disposed on the substrate abutting the first gate stack. The device further includes a second spacer element adjacent the first spacer element. A first raised source and a first raised drain laterally contacts sidewalls of the second spacer element.

In an embodiment of the semiconductor device, the second spacer element is silicon oxide. In a further embodiment, the device includes contact features which directly interface with the second spacer element.

The present disclosure also provides another embodiment of a semiconductor device. In the embodiment, the device includes a gate stack disposed on a semiconductor substrate. The gate stack includes a first surface interfacing the semiconductor substrate and a second surface opposing the first surface and a first and second sidewall. A first spacer element abuts the first and second sidewalls of the gate stack and has a height that extends from the first surface to the second surface of the gate stack. A second spacer element abuts sidewalls of the first spacer element and has a height that is less than the height of the first spacer element. A raised source/drain region abuts the second spacer element.

The disclosed semiconductor device may further include a contact etch stop layer interfacing the first spacer element and the second spacer element. In an embodiment, the second spacer element includes a first sidewall that is longer than a second sidewall. The first sidewall abuts the first spacer element. In an embodiment, the second spacer element is between approximately 7 nanometers and approximately 10 nanometers in thickness.

The present disclosure also provides in one embodiment of a method for making a semiconductor device. A method for making a semiconductor device includes forming a gate stack on a semiconductor substrate. A first spacer element is formed adjacent the gate stack. An epitaxy process forms a raised source and a raised drain. A silicon oxide layer is formed on the semiconductor substrate. The silicon oxide layer is etched to provide a second spacer element. The second spacer element abuts and interposes the first spacer element and the raised source or the raised drain region.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor device, comprising:
    a semiconductor substrate;
    a first gate stack disposed on the semiconductor substrate;
    a first spacer element abutting the first gate stack;
    a second spacer element adjacent the first spacer element, wherein the second spacer element includes silicon oxide;
    a first raised source/drain region laterally contacting sidewalls of the second spacer element; and
    a contact disposed on the substrate and connected to the first raised source/drain region, wherein the contact includes an interface with the second spacer element.

2. The semiconductor device of claim 1, wherein the semiconductor substrate includes a silicon germanium (SiGe) feature underlying the first raised source/drain region.

3. The semiconductor device of claim 1, wherein the first raised source/drain region comprises epitaxial silicon.

4. The semiconductor device of claim 1, wherein the first raised source/drain region and the first gate stack are portions of a P metal-oxide-semiconductor (PMOS) transistor.

5. The semiconductor device of claim 1, wherein the first gate stack includes a high-k dielectric and a metal gate electrode.

6. The semiconductor device of claim 1, wherein the first spacer element has a first height and the second spacer element has a second height, and the first height is greater than the second height.

7. The semiconductor device of claim 1, wherein the first spacer element includes silicon nitride.

8. The semiconductor device of claim 1, further comprising:
    a second gate stack disposed on the semiconductor substrate and spaced a distance from the gate stack;
    a third spacer element abutting the second gate stack;
    a fourth spacer element adjacent the third spacer element;
    a second raised source and a second raised drain laterally contacting sidewalls of the fourth spacer element; and
    an interlayer dielectric layer overlying the first gate stack and the second gate stack.

9. The semiconductor device of claim 8, further comprising:
    an isolation feature disposed in the semiconductor substrate interposing the first gate stack and the second gate stack, where the first gate stack is a gate of a PMOS device and the second gate stack is a gate of an NMOS device.

10. A semiconductor device, comprising:
    a gate stack disposed on a semiconductor substrate, wherein the gate stack includes a first surface interfacing with the semiconductor substrate and a second surface opposing the first surface and a first sidewall and a second sidewall;
    a first spacer element abutting the first and second sidewalls of the gate stack, wherein the height of the first spacer element extends from the first surface to the second surface of the gate stack;
    a second spacer element abutting sidewalls of the first spacer element, wherein the height of the second spacer is less than the height of the first spacer element; and
    a source/drain region abutting the second spacer element, wherein the source/drain region abuts the second spacer element above the first surface of the gate stack.

11. The semiconductor device of claim 10, wherein the source/drain region is a raised source/drain region and wherein the raised source/drain region overlies at least one of a silicon region or a silicon germanium (SiGE) region.

12. The semiconductor device of claim 10, further comprising:
    a contact etch stop layer interfacing the first spacer element and the second spacer element.

13. The semiconductor device of claim 10, wherein the second spacer element includes a first sidewall that is longer than a second sidewall, wherein the first sidewall abuts the first spacer element.

14. The semiconductor device of claim 10, wherein the second spacer element is between approximately 7 nanometers and approximately 10 nanometers in width.

15. The semiconductor device of claim 10, further comprising:
    a contact disposed above the semiconductor substrate and connected to the source/drain region, wherein the contact includes an interface with the second spacer element.

16. A semiconductor device, comprising:
    a semiconductor substrate;
    a gate stack having a bottom surface disposed on the semiconductor substrate and extending to an opposing top surface;
    a first spacer element having a first surface co-planar with the bottom surface of the gate stack, wherein the first spacer element abuts the gate stack;
    a second spacer element having a first surface co-planar with the bottom surface of the gate stack, wherein the second spacer element is adjacent the first spacer element; and
    a source/drain region laterally contacting sidewalls of the second spacer element.

17. The device of claim 16, wherein the second spacer has a second surface opposite the first surface of the second spacer element and the first spacer element has a second surface opposite the first surface of the second spacer element, wherein the second surface of the first spacer element is a greater distance from the semiconductor substrate.

18. The device of claim 16, further comprising:
    a contact disposed on the substrate and connected to the source/drain region, wherein the contact includes an interface with the second spacer element.

19. The device of claim 18, wherein the source/drain region is a raised source/drain region.

* * * * *